Dec. 16, 1969 O. E. SAALBORN 3,484,706
WIDEBAND FM DETECTOR CIRCUIT EMPLOYING A PHASE COMPARATOR
Filed Nov. 1, 1966

INVENTOR.
OTTO E. SAALBORN
BY R. J. Frank
ATTORNEY.

United States Patent Office 3,484,706
Patented Dec. 16, 1969

3,484,706

WIDEBAND FM DETECTOR CIRCUIT EMPLOYING A PHASE COMPARATOR

Otto E. Saalborn, Whitestone, N.Y., assignor to General Telephone & Electronics Laboratories Incorporated, a corporation of Delaware Filed Nov. 1, 1966, Ser. No. 591,152
Int. Cl. H03d 1/18
U.S. Cl. 329—103 2 Claims

ABSTRACT OF THE DISCLOSURE

A frequency modulation detector suitable for fabrication by integrated circuit techniques. The detector employs a phase comparator which compares the FM input signal with the output of a voltage controlled resistance capacitance oscillator. The output of the phase comparator controls the frequency of the oscillator and provides the demodulated output.

This invention relates to detectors for demodulating frequency-modulated signals and, in particular, to an FM detector which uses only components that can be fabricated by presently available integrated circuit techniques.

During recent years there has been a steady trend toward the use of integrated circuits in electronic equipment. One potentially useful form of integrated circuit is the monolithic type in which an entire electronic circuit is placed on a tiny chip of semiconductor material. Such circuits require little space, are inexpensive, and offer other advantages over conventional circuits employing discrete components.

A disadvantage of the monolithic circuit is that the present state of the art does not permit the fabrication of inductors or transformers by known processing techniques. In addition, resistors and capacitors having large values are extremely difficult to product in monolithic form. One expedient which has been used to circumvent this limitation is to "outboard" discrete components on the monolithic circuit; i.e. essentially conventional coils, transformers and other components are connected to the monolithic circuit but do not form an integral part thereof. However, this expedient removes many of the advantages inherent in the monolithic circuit and is therefore not a fully satisfactory solution to the problem.

One of the applications in which monolithic circuits would be desirable is as a demodulator in high fidelity FM radio and television receivers. However, conventional FM demodulator circuits, such as the phase-shift discriminator and ratio detector, contain inductive elements which cannot be fabricated by integrated circuits processes and therefore do not lend themselves to this form of circuit. Accordingly, it is an object of my invention to provide a detector for frequency-modulated signals which does not require transformers or inductors. Further, the detector I have invented employs capacitors and resistors having values which permit them to be fabricated easily by integrated circuit techniques.

Another object is to provide a low-distortion FM detector which has an extremely linear detection characteristic over a wide frequency range and is particularly suitable for FM stereo receivers. Such detectors must have a bandwidth wide enough to faithfully reproduce the modulation on the input signal.

Still another object is to provide an FM detector which does not require critical alignment and which provides essentially distortionless detection over a wide range of signal frequencies.

In accordance with my invention, a circuit which employs only resistors, capacitors and transistors and does not require coils or transformers is provided for detecting a constant-amplitude frequency-modulated carrier signal. The circuit comprises a phase comparator having first and second input junctures and a common juncture. (The term "juncture" is used for clarity in describing the circuit arrangement. It shall be understood that in a monolithic circuit employing my invention no discrete junctures or terminals would normally exist except at the input and output of the device.) The frequency-modulated carrier is coupled between one of the input junctures and the common juncture (hereinafter called ground), and the output of a voltage-controlled resistance-capacitance (R-C) oscillator is coupled between the other input juncture and ground. Oscillator control means is coupled between an input juncture of the phase comparator and the input of the oscillator.

In one embodiment of the invention, the phase comparator comprises a semiconductor element having first and second input electrodes and a common grounded electrode. If a transistor is used as the semiconductor element the first and second input electrodes may be the collector and base respectively and the common electrode is the emitter. The constant-amplitude frequency-modulated carrier signal is applied between the collector and emitter electrodes of the transistor and the output of an astable R–C multivibrator is coupled between the base and emitter electrodes.

The collector of the phase-comparator transistor is coupled through a low-pass filter and an emitter follower to the input of the multivibrator to provide a signal corresponding to the frequency and phase of the incoming signal. The nominal frequency of oscillation of the multivibrator is determined by a pair of series-connected resistors having their junction connected to the base electrode of the emitter follower and their other ends to the collector and emitter electrodes respectively. The emitter follower provides a low impedance at the input of the multivibrator thereby eliminating the need for a large decoupling capacitor which would be difficult to provide in a monolithic circuit. A resistor and capacitor are connected in series between the collector of the phase comparator transistor and the common terminal, the demodulated output being obtained across the capacitor.

When an input signal of constant frequency is applied across the collector-emitter electrodes of the phase comparator transistor, the R-C oscillator generates the same frequency, phase displaced with respect to the input signal. The phase displacement is such that voltage is applied to both the base and collector electrodes of the transistor during a predetermined portion of the cycle driving the transistor into conduction and effectively grounding the collector electrode. During the remainder of the cycle, the transistor becomes non-conducting and the voltage at the collector electrode is determined solely by the constant-amplitude frequency-modulated input signal. As a result, the voltage at the collector of the phase comparator transistor is a rectangular error voltage having an amplitude which swings between essentially zero and the amplitude of the input signal. This rectangular wave is coupled through the low-pass filter and emitter follower to provide a control voltage for the R-C oscillator.

As the frequency of the input signal changes, the frequency and phase of the error voltage is altered changing the control voltage at the input of the R-C oscillator. This change is in a direction to alter the frequency of the oscillator so that it will approach the new frequency of the input signal. The output voltage corresponds to the change in frequency.

The above objects of and the brief introduction to the present invention will be more fully understood and further objects and advantages will become apparent from a study of the following description in connection with the drawings, wherein.

Figure 1:
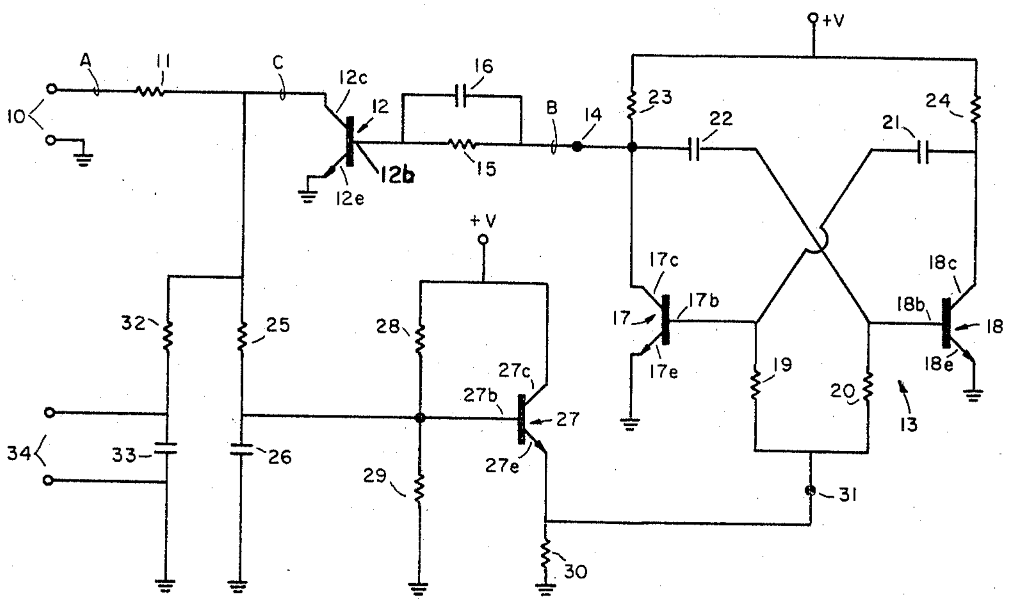
FIG. 1 is a schematic diagram of one embodiment of my invention.

Referring to FIG. 1, there is shown a schematic diagram of the frequency modulation detector. The circuit is illustrated conventionally in order to describe its operation as clearly as possible. However, it shall be understood that it has been designed for production by monolithic techniques and that when fabricated in this form no discrete elements or terminals would normally be employed.

Figure 2:
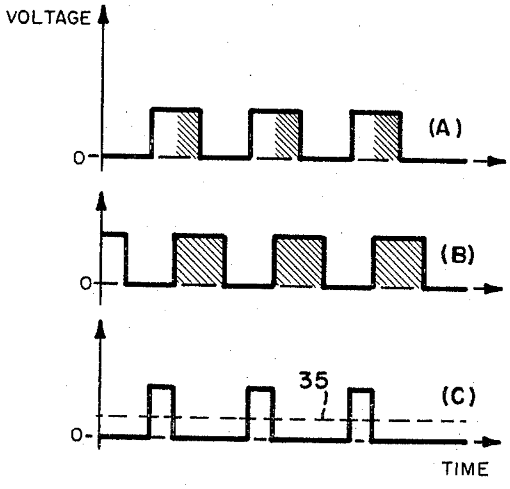
FIGS. 2A–2C show idealized voltage waveforms at various points in the circuit for a given input frequency.
Figure 3:
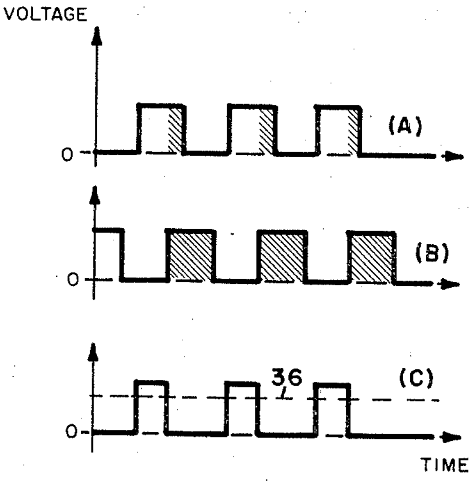
FIGS. 3A–3C illustrate the idealized voltage waveform at the same points at a different input frequency.

A constant-amplitude frequency-modulated input signal is coupled across input terminals 10. In an FM receiver, this signal would be generated at the output of a limiter stage and would have a constant amplitude envelope such as that shown in FIGS. 2A and 3A. The letters designating the waveform of FIGS. 2 and 3 correspond to the points in the circuit at which the voltage was measured with respect to the common terminal or ground. Thus, when the voltage at a particular point is described it shall be understood that the voltage referred to is between that point and ground.

The input signal applied across terminal 10 is coupled through resistor 11 across the collector electrode 12*c* and emitter electrode 12*e* of a type NPN phase-comparator transistor 12 which functions as a phase comparator. The output of a resistance-capacitance (R-C) astable multivibrator 13 is coupled from juncture point 14 through a network consisting of a resistor 15 and a capacitor 16 to the base electrode 12*b* of transistor 12. The output of multivibrator 13 is adjusted to have the same frequency as the input signal under steady state conditions but is phase-displaced therefrom.

Multivibrator 13 comprises a pair of type NPN transistors 17 and 18 having their emitter electrodes 17*e* and 18*e* grounded and their base electrodes 17*b* and 18*b* coupled through series-connected resistors 19 and 20. The base electrode 17*b* of transistor 17 is coupled by a capacitor 21 to the collector electrode 18*c* of transistor 18 and the base electrode 18*b* of transistor 18 is coupled by a capacitor 22 to the collector electrode 17*c* of transistor 17. The collector electrodes of both transistors 17 and 18 are connected through resistors 23 and 24 respectively to a source of voltage +V having its positive terminal connected to resistors 23 and 24 and its negative terminal connected to ground.

Referring to FIGS. 2A and 3A, it is seen that during a first portion of each cycle the input signal is coupled to the collector electrode of transistor 12 and the voltage on the base electrode is zero. During this portion of the cycle, the voltage at collector electrode 12*c* is coupled by means of resistor 25 and capacitor 26 to the base electrode 27*b* of emitter-follower transistor 27. Resistor 25 and capacitor 26 comprise a low-pass filter having a time constant which provides sufficient band-pass to assure that the circuit will follow frequency variations in the input signal.

A pair of series-connected resistors 28 and 29 are connected between the source of positive voltage +V and ground. These resistors, which have their junctions connected to the base 27*b* of transistor 27 have values chosen to provide a voltage at the junction of resistors 19 and 20 which will set the frequency of oscillation of multivibrator 13 to the center freqeuncy of the carrier to be demodulated. The emitter 27*e* of transistor 27 is connected to a resistor 30 and through input juncture 31 to the junction of series-connected resistors 19 and 20.

A resistor 32 and a capacitor 33 are connected in series between the collector electrode of transistor 12 and ground. These components filter RF carrier from the error signal at the collector electrode of transistor 12 to provide the demodulated output. Output terminals 34 are connected across capacitor 33 for coupling to the next stage of the receiver.

During a second portion of the cycle (shown cross-hatched) (FIG. 2*a*), the input voltage is applied to collector electrode 12*c* and the output of multivibrator 13 is coupled to the base 12*b*. As a result transistor 12 conducts effectively grounding the collector electrode 12*c*. After the input voltage drops to zero, the multivibrator continues to generate an output voltage (see cross-hatched part of FIG. 2B) but the collector voltage remains at zero.

As is evident from FIG. 2C, the voltage at point C of FIG. 1 is positive only during the portion of the cycle when the input signal is present and the voltage at the base electrode of transistor 12 is zero. Accordingly the average value of this voltage is positive as shown by the dashed line 35. The average value 35 of the voltage at point C is obtained at the input juncture 31 of multivibrator 13 by filtering in the low-pass filter comprising resistor 25 and capacitor 26. This voltage controls the frequency of multivibrator 13 by varying the voltage at the base electrodes of transistors 17 and 18.

If the input signal increases in frequency as shown in FIG. 3A, the portion of the cycle during which there is a positive potential at collector electrode 12*c* increases and the average value of the voltage increases as shown at 36 in FIG. 3C. Accordingly, the control voltage rises at input juncture 31 and the multivibrator frequency is increased until, as shown in FIGS. 3A and 3B it has the same value as the input signal. The demodulated voltage across terminals 34 continues to follow the input modulation frequency due to the corresponding increase in the frequency of the error signal FIG. 3C. Consequently, a decrease in input frequency causes a decrease in the average control voltage at the input of multivibrator 13 and a decrease in the multivibrator frequency.

In order to provide maximum detector efficiency and the the largest possible detected output voltage, the gain in the feed-back loop is kept low so that a relatively large phase error exists between the multivibrator signal and the incoming signal.

In a typical circuit employing the invention, the component values would be as follows:

| | | |
|---|---|---|
| Resistor **11** | ohms | 1000 |
| Transistor **12** | | Type 2N2784 |
| Resistor **15** | ohms | 2200 |
| Capacitor **16** | pf | 15 |
| Transistors: | | |
| **17** | | Type 2N2784 |
| **18** | | Type 2a2784 |
| Resistors: | | |
| **19** | ohms | 3000 |
| **20** | do | 3000 |
| Capacitors: | | |
| **21** | pf | 10 |
| **22** | do | 10 |
| Resistors: | | |
| **23** | ohms | 330 |
| **24** | do | 330 |
| **25** | do | 15000 |
| Capacitor **26** | pf | 500 |
| Transistor **27** | | Type 2N2784 |
| Resistors: | | |
| **28** | ohms | 68000 |
| **29** | do | 4700 |
| **30** | do | 1000 |
| **32** | do | 10000 |
| Capacitor **33** | pf | 10 |
| Voltage V | volts | 10 |

An FM detector having the above circuit values has a 1.4 megacycle bandwith at a center frequency of 10.7 megacycles making it particularly suitable for FM applications. While these circuit values are typical, other component values may also be used. In addition, although the configuration shown for transistor 12 was found superior it is also possible to connect the input signal to the base electrode of the phase comparator transistor and the multivibra'or output to the collector electrode.

What is claimed is:

1. A circuit for detecting a frequency-modulated carrier signal comprising (a) a phase comparator semiconductor element having first and second input electrodes and a third electrode coupled to a common juncture, said frequency-modulated carrier being coupled between one of said input electrodes and said common jncture, (b) a voltage-controlled resistance-capacitance oscillator having input and output junctures, the output juncture of said resistance-capacitance oscillator being coupled to the other input electrode of said phase comparator semiconductor, and (c) oscillator control means coupled between said first input electrode and said semiconductor element and the input juncture of said resistance-capacitance oscillator, said oscillator control means comprising (1) a low-pass filter consisting of a series-connected first resistor and a capacitor, said first resistor being connected to said first input electrode of said phase-comparator semiconductor element and said capacitor being connected to said common juncture, (2) an emitter-follower consisting of a transistor having collector, base and emitter electrodes, said collector electrode being coupled to a voltage source, said base electrode being connected to the junction between said capacitor and said first resistor and said emitter electrode being coupled to the input juncture of said resistance-capacitance oscillator, and (3) a second resistor connected between said emitter electrode and said common juncture.

2. A circuit for detecting a frequency-modulated carrier signal comprising (a) a first transistor having collector, base and emitter electrodes, said emitter electrode being coupled to a common juncture, the frequency-modulated carrier signal being coupled between said collector electrode and said common juncture, (b) a voltage-controlled resistance-capacitance oscillator having input and output junctures, means connecting the base of said first transistor to said output juncture said oscillator comprising (1) second and third transistors each having a collector, base and emitter electrode, the emitter electrodes of said second and third transistors being coupled to said common juncture, (2) first and second series-connected resistors coupled between the base electrodes of said second and third transistors, the junction of said first and second resistors being connected to said input juncture, (3) first and second capacitors, said first capacitor coupling the base electrode of said second transistor to the collector electrode of said third transistor and said second capacitor coupling the base electrode of said third transistor to the collector electrode of said second transistor, (4) Third and fourth series-connected resistors coupled between the collector electrodes of said second and third transistors, the junction of said third and fourth resistors being connected to a source of voltage, and (5) means coupling the collector electrode of said second transistor to said output juncture, (c) oscillator-control means, said oscillator-control means comprising (1) a low-pass filter consisting of a series-connected fifth resistor and third capacitor, said fifth resistor being connected to the collector electrode of said first transistor and said third capacitor being connected to said common juncture, (2) a fourth transistor having collector, base and emitter electrodes, said collector electrode being coupled to said source of voltage, said base electrode being coupled to the junction of said fifth resistor and third capacitor and said emitter electrode being coupled to the input juncture of said resistance-capacitance ocsillator, (3) sixth and seventh resistors, said sixth resistor being coupled between the base and collector electrodes of said fourth transistor and said seventh resistor being coupled between the base electrode of said fourth transistor and said common juncture, and (4) an eight resistor coupled between the emitter electrode of said fourth transistor and said common juncture, and (d) a series-connected ninth resistor and fourth capacitor coupled between the collector electrode of said first transistor and said common juncture, the voltage across said fourth capacitor corresponding to the modulation on said frequency-modulated carrier.

References Cited

UNITED STATES PATENTS

| | | | |
|---|---|---|---|
| 3,204,195 | 8/1965 | Maestre | 331—27 X |
| 3,221,260 | 11/1965 | Henrion | 307—233 X |
| 3,231,829 | 1/1966 | Reid | 331—27 X |
| 3,249,893 | 5/1966 | Castellano | 331—27 X |
| 3,371,281 | 2/1968 | Powell | 329—122 X |

ALFRED L. BRODY, Primary Examiner

U.S. Cl. X.R.

329—50, 122, 136; 307—233; 325—346; 331—25, 27